United States Patent [19]

Matsuoka

[11] Patent Number: 5,017,154
[45] Date of Patent: May 21, 1991

[54] CONNECTOR FOR AN ELECTRIC PART

[75] Inventor: Noriyuki Matsuoka, Tokyo, Japan

[73] Assignee: Yamaichi Electric Mfg. Co., Ltd., Tokyo, Japan

[21] Appl. No.: 458,378

[22] Filed: Dec. 28, 1989

[30] Foreign Application Priority Data

Dec. 29, 1988 [JP] Japan .................................. 63-331971

[51] Int. Cl.$^5$ ............................................ H01R 13/00
[52] U.S. Cl. ...................................... 439/492; 439/886
[58] Field of Search ................................ 439/492–499, 439/629–637, 886

[56] References Cited

U.S. PATENT DOCUMENTS 4,526,436  7/1985  Aso ...................................... 439/493
4,838,799  6/1989  Tonooka ............................. 439/886

Primary Examiner—Joseph H. McGlynn
Attorney, Agent, or Firm—Wenderoth, Lind & Ponack

[57] ABSTRACT

In a connector for providing electrical contact by holding a terminal of an electric part, a socket for an electric part is characterized in that a holding portion for holding the terminal conforms to a molded portion of a connector body. The holding portion is provided on its outer surface with a conductive deposit. A resilient pressurizing piece is disposed opposite the conductive deposit, and the terminal of the electric part is held between the conductive deposit and the resilient pressurizing piece.

7 Claims, 6 Drawing Sheets

CONNECTOR FOR AN ELECTRIC PART

BACKGROUND OF THE INVENTION

1. Field of the Invention

This invention relates to a connector for an electric part for holding terminals of an electric part in electrical contact.

2. Brief Description of the Prior Art

In general, a contact for holding terminals of an electric part in electrical contact, such as an IC or the like, comprises a pair of contacting pieces formed of a perforated metallic piece bent into a predetermined shape and disposed in such a manner as to be opposite each other. Many such contacts are accommodated in and held by a connector body formed of an insulating material at small pitches. The terminals of the electric part are inserted into an accommodating chamber containing the contacts and inserted between the contacting pieces formed of the perforated metallic piece to realize a contacted state.

In the above-mentioned contact, it is necessary to provide at least a pair of contacting pieces formed of perforated metallic pieces. This contact requires complicated machining in order to provide various holding constructions and therefore, a large amount of material is consumed. Furthermore, a comparatively large space in the accommodating chamber of the connector body is required for accommodating the pair of contacting pieces. As a consequence, it is difficult to realize small pitches in the contact arrangement and a realization of a compact size is jeopardized. On the other hand, if one of the pair of contacting piece is omitted, a reliable contacted state is difficult to achieve.

The present invention has been accomplished in order to effectively cope with the above problems.

SUMMARY OF THE INVENTION

It is therefore an object of the present invention to provide a socket for an electric part, in which the contacting piece is of a single structure instead of separate pieces as in the prior art and yet provides a satisfactory electric contact.

Another object of the present invention is to provide a socket for an electric part, for which complicated machining is not required.

A further object of the present invention is to provide a socket for an electric part, for which molding is easy and material consumption is extensively reduced.

A still further object of the present invention is to provide a socket for an electric part, in which the space in an accommodating chamber of a connector body is small.

A yet further object of the present invention is to provide a socket for an electric part, in which contacts can be arranged at small pitches.

In order to achieve the above objects, there is essentially provided in a connector for providing electrical contact by holding a terminal of an electric part, a socket for an electric part characterized in that the configuration of one terminal holding portion thereof is configured by a molded portion of a connector body. The configured portion is provided on an outer surface thereof with a conductive deposit. A resilient pressurizing piece is disposed opposite the conductive deposit, and the terminal of the electric part is held between the conductive deposit and the resilient pressurizing piece.

One holding piece for holding the terminal of the electric part is formed of a conductive deposit firmly attached to the configured portion formed during molding of the connector body. The terminal of the electric part is held between the conductive deposit and the resilient pressurizing piece disposed opposite the conductive deposit, and the terminal is urged against the conductive deposit by the resilient pressurized piece, to thereby provide electric contact.

In the above-mentioned connector, as the resilient pressurizing piece for holding the terminal of the electric part is of a single construction, complicated machining required for providing various holding constructions in the prior art is no longer required. Therefore, molding is easy and material consumption is small. Furthermore, the accommodating chamber of the connector body is limited to a space just large enough for accommodating a single piece of the resilient pressurizing piece. Accordingly, it is advantageous in realizing small pitches and in providing a compact contact arrangement. Therefore, in spite of its single piece construction, there can be obtained the same contacting pressure as that of the prior art such that the electrical contact can be reliably maintained.

In the above-mentioned contact, the conductive deposit functions as a conventional contact or the conductive deposit and the resilient pressurizing piece function as a contact. At this time, the resilient pressurizing piece is brought into contact with the conductive deposit under pressure and the resilient pressurizing piece communicates with the conductive deposit when the resilient plated piece is mounted.

For an understanding of the principles of the invention, reference is made to the following description of preferred embodiments thereof as illustrated in the accompanying drawings.

DETAILED DESCRIPTION OF THE EMBODIMENT

The embodiment of the present invention will be described hereunder with reference to FIGS. 1 through 23.

In the drawings, the reference numeral 1 denotes a connector body formed of an insulating material such as synthetic resin or the like. The connector body 1 has a chamber 4 for accommodating terminals 3 of an electric part 2. An internal wall of the accommodating chamber 4 opposite one side of the terminals 3 inserted into the accommodating chamber 4 serves as one holding portion 5 of the terminals 3 and the holding portion 5 is configured when the connector body 1 is molded. A metal plating is applied to the outer surface of the holding portion 5 to form a conductive deposit 6.

The holding portion 5 is narrow and long in the inserting direction of the terminals 3. Similarly, the conductive deposit 6 is firmly and intimately attached to the outer surface thereof and is also narrow and long.

A resilient pressurizing piece 7 is disposed opposite the conductive deposit 6. The resilient pressurizing piece 7 is of a single piece structure formed of a punched and bent metal piece. The resilient pressurizing piece 7 presses the terminal against the conductive deposit 6 and holds the terminal 3 between the resilient pressurizing piece 7 and the conductive deposit 6 in order to realize an electric contact. In this case, the resilient pressurizing piece 7 functions only to press the terminal 3 against the conductive deposit 6 or otherwise functions as a contact forming element for transmitting a signal therefrom while pressing the terminal 3 against the conductive deposit 6.

In order to have the resilient pressurizing piece 7 function as the contact forming element for transmitting a signal, a male terminal 8 is continuously provided at a lower end of the resilient pressurizing piece 7. The male terminal 8 is inserted, under pressure, into an embedding hole formed in a bottom wall of the accommodating chamber 8 and projected downwardly of the connector body 1 so as to be connected with a distributing board, etc.

Several embodiments of the resilient pressurizing piece 7, when the resilient pressurizing piece 7 functions as a contact forming element, will be described in detail.

In FIGS. 1 through 7, a normally closed contact is formed by the conductive deposit 6 and the resilient pressurizing piece 7, and the male terminal 8 of the resilient pressurizing piece 7 is press fitted into the embedding hole formed in the bottom wall of the accommodating chamber 4. At the same time, a lower end of the conductive deposit 6 is formed sufficiently long along the inner surface of the embedding hole to contact the end of the male terminal 8 as it is urged into contact with the lower end of the conductive deposit 6 after the terminal 8 is press-fitted into the embedding hole so that the terminal 8 and the deposit 6 communicate with each other.

Figure 1:
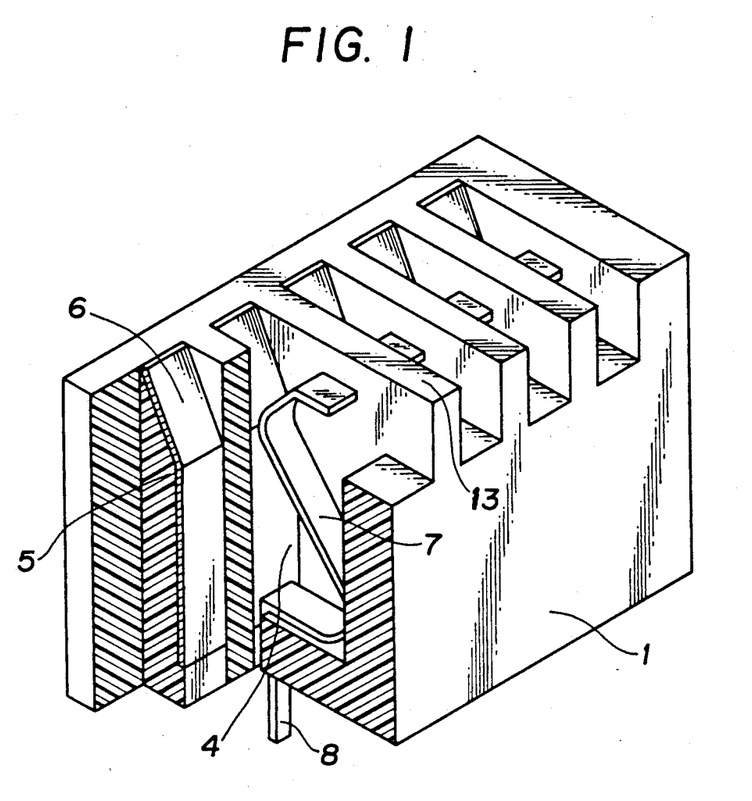
FIG. 1 is a perspective view, partly in section, of a connector for an electric part according to one embodiment of the present invention.
Figure 2:
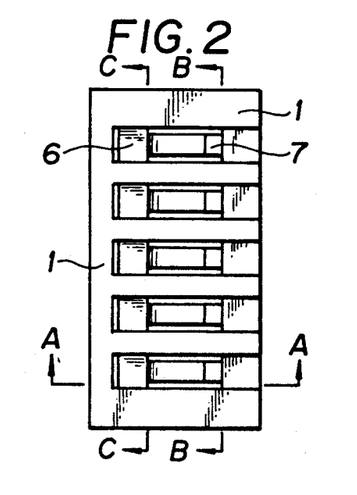
FIG. 2 is a plan view thereof.
Figure 3:
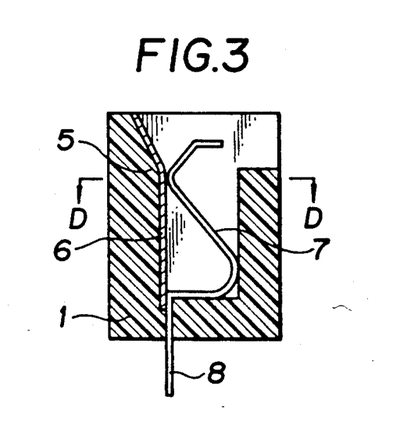
FIG. 3 is a sectional view taken on line A—A of FIG. 2.
Figure 4:
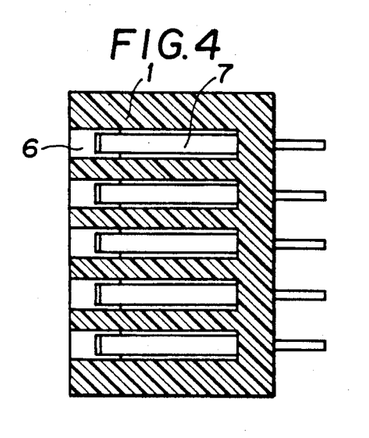
FIG. 4 is a sectional view taken on line B—B of FIG. 2.
Figure 5:
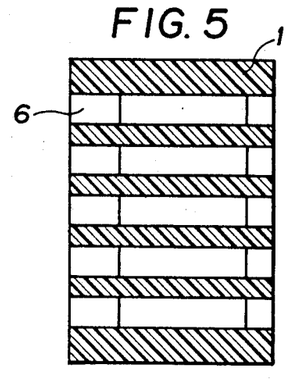
FIG. 5 is a sectional view taken on line C—C of FIG. 2.
Figure 6:
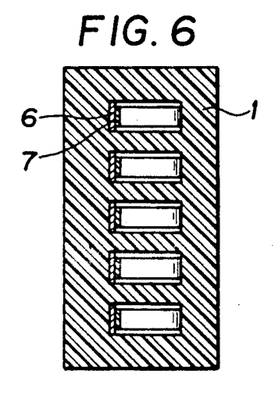
FIG. 6 is a sectional view taken on line D—D of FIG. D.
Figure 7:
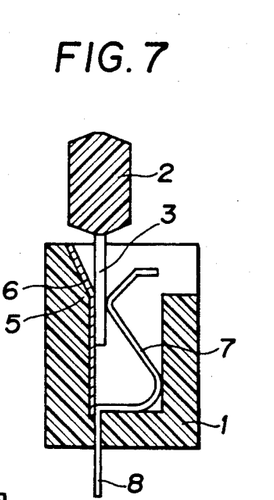
FIG. 7 is a sectional view showing the connector of the electric part now contacted with terminals of the electric part in FIG. 3.

In the above embodiment, the terminal 3 of the electric part 2 such as an IC, etc., as shown in FIG. 7, is contacted at its one side with the holding portion 5, i.e., the conductive deposit 6, the configuration of which conform to the inner wall of the accommodating chamber 4, and at its other side with the resilient pressurizing piece 7. The terminal 3 is pressed and contacted against the conductive deposit 6 by the resilient pressurizing piece 7 and held between the deposit 6 and the piece 7. A signal from the terminal 3 can flow to the deposit 6, the piece 7 and the male terminal 8.

Figure 8:
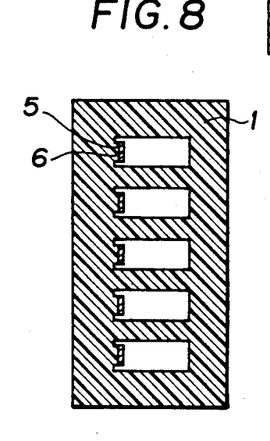
FIGS. 8 through 12 are sectional views showing a configured portion which is configured by a connector molding portion for applying a conductive deposit.

FIG. 8 shows one example in which the holding portion 5 formed at the inner wall of the accommodating chamber 4 is configured such that the holding portion 5 is projected in the inserting direction of the terminal 3 within the accommodating chamber 4 and the conductive deposit 6 is formed on the surface of the projection holding portion 5.

Figure 9:
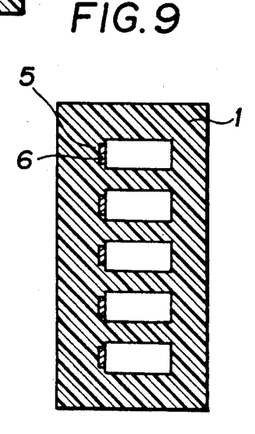

FIG. 9 shows another example in which a groove is formed in the inner wall of the accommodating chamber 4 in the inserting direction of the terminal and the conductive deposit 6 is applied to the interior of the groove-shaped holding portion 5.

In FIGS. 8 and 9, the resilient pressurizing piece 7 disposed opposite the conductive deposit 6 is omitted in order to provide clarity to the drawings.

Figure 10:
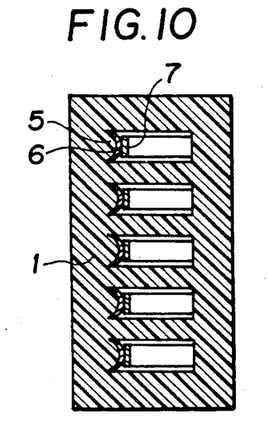

In FIG. 10, the projection holding portion 5 of FIG. 8 is formed into an arcuate shape in the short width direction of the resilient pressurizing piece 7 and projected along the inserting direction of the terminal, the conductive deposit 6 is formed on the surface of the arcuate projection holding portion, and a contacting pressure against the terminal 3 is increased so that a pressurizing force of the resilient pressurizing piece 7 is concentrically applied to a ridgeline of the arcuate projection holding portion 5.

Figure 11:
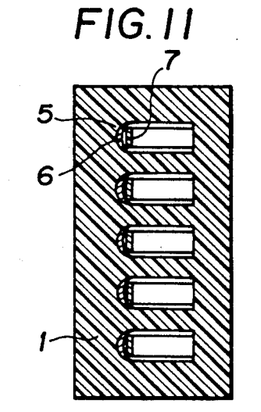

FIG. 11 shows still another example in which the groove-shaped holding portion 5 of FIG. 9 is formed in an arcuate shape in the short width direction of the resilient pressuring piece 7 and disposed along the inserting direction of the terminal. The conductive deposit 6 is applied to the surface of the arcuate groove-shaped holding portion 5 so that a pressing force is concentrically applied to the conductive deposit 6 at two points on the right and left edges of the resilient pressurizing piece 7, to thereby stabilize the contacted state of the terminal 3.

Figure 12:
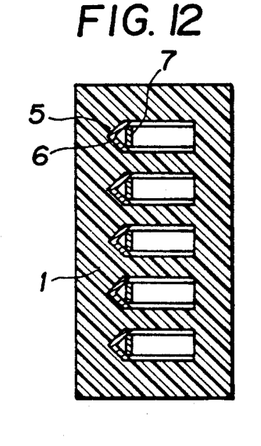

FIG. 12 shows yet another example in which the groove-shaped holding portion 5 of FIG. 11 is formed into a V-shaped configuration so that the terminal 3 is likewise contacted with the conductive deposit at two points.

Figure 13:
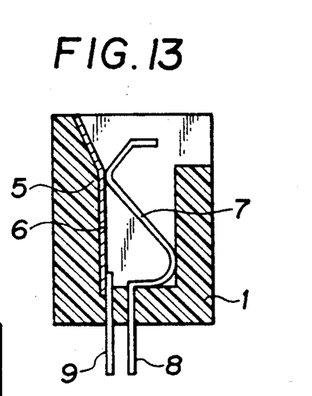
FIG. 13 is a sectional view showing an embodiment for transmitting a signal from the conductive deposit and a resilient pressurizing piece.

In a case in which the resilient pressurizing piece 7 functions as a contact forming element, the resilient pressurizing piece 7 and the conductive deposit 6, as shown in FIG. 13, are not shorted at a portion away from where they contact the terminal 3. A male terminal 9 is embedded in the bottom wall of the accommodating chamber 4 and is connected to the lower end of the conductive deposit 6 and projected downward of the connector body 1. Another male terminal 8 at the lower end of the resilient pressurizing piece is projected downwardly of the connector body 1 so that a signal from the terminal 3 can be transmitted from the conductive deposit 6 and the resilient pressurizing piece 7.

The examples of FIGS. 14 through 17 are different from the example of FIG. 13. In the examples of FIGS. 14 through 17, the conductive deposit 6 and the resilient pressurizing piece 7 are shorted at portions thereof away from where they contact the terminal 3 so that a signal from the terminal 3 can be transmitted from the male terminal 8 continuously connected to the lower end of the resilient pressurizing piece 7.

Figure 14:
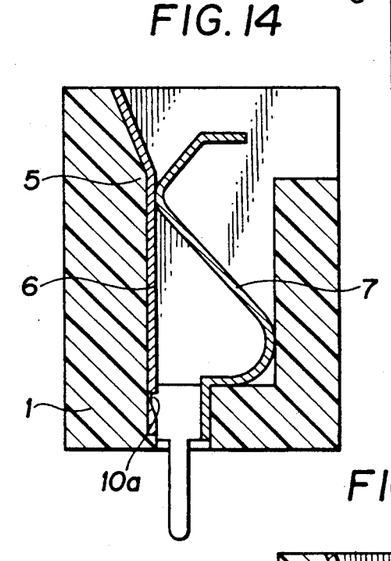
FIGS. 14 through 17 are sectional views for exemplifying means for shortening the conductive deposit and the resilient pressurizing piece at a portion other than the connecting portion with respect to the terminal.

First, FIG. 14 shows an example in which a press fit portion having a press fit nail 10a is formed on the continuously connected portion between the conductive deposit 6 and the male terminal of the lower end of the resilient pressurizing portion 7. The press fit nail 10a bites into the lower end of the conductive deposit 6 disposed along the inner surface of the embedding hole while the press-fit portion is press-fit into the embedding hole, so that a positive connection is made with the conductive deposit 6.

Figure 15:
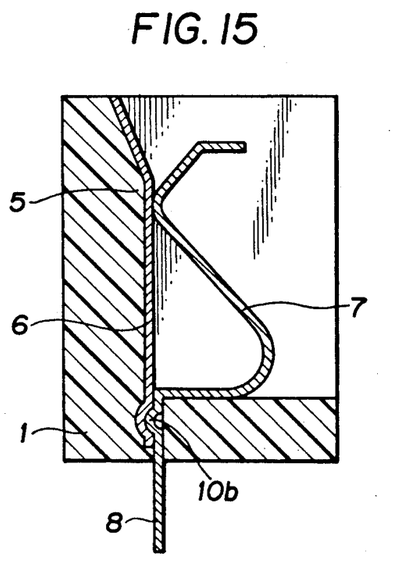

In the example of FIG. 15, an arcuate knob portion 10b, as shown in section, is formed on the press-fit portion of the end of the male terminal 8 by embossing or the like, so that when the knob portion 10b is press fitted into the embedding hole, the surface of the lower end of the conductive deposit 6 disposed along the inner surface of the embedding hole is strongly pressed by the knob portion 10b and is plastically deformed so as to cause a short.

Figure 16:
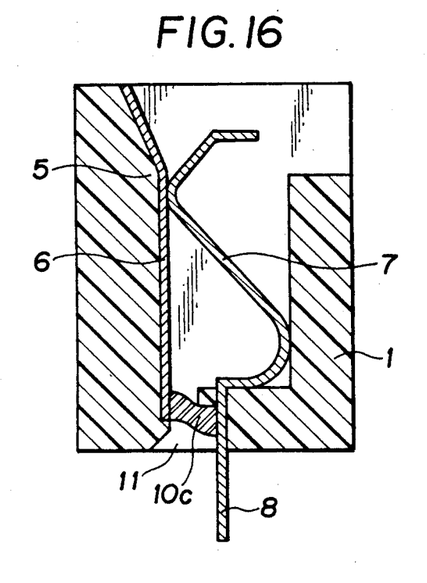

In the example of FIG. 16, as the shorting means, the lower end of the conductive deposit 6 and the end of the mail terminal 8 are shorted by a heat melted metal 10c such as solder or the like. In this case, an opening 11 for introducing the heat melted metal 10c is formed adjacent where the male terminal 8 is projected.

Figure 17:
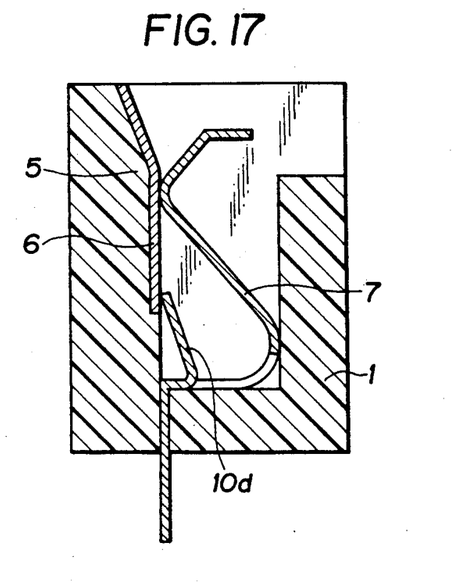

Furthermore, FIG. 17 shows another example in which a resilient piece 10d is formed by cutting a lower end of the resilient pressurizing piece 7. The resilient piece 10d resiliently contacts the surface of the conductive deposit 6.

Figure 18:
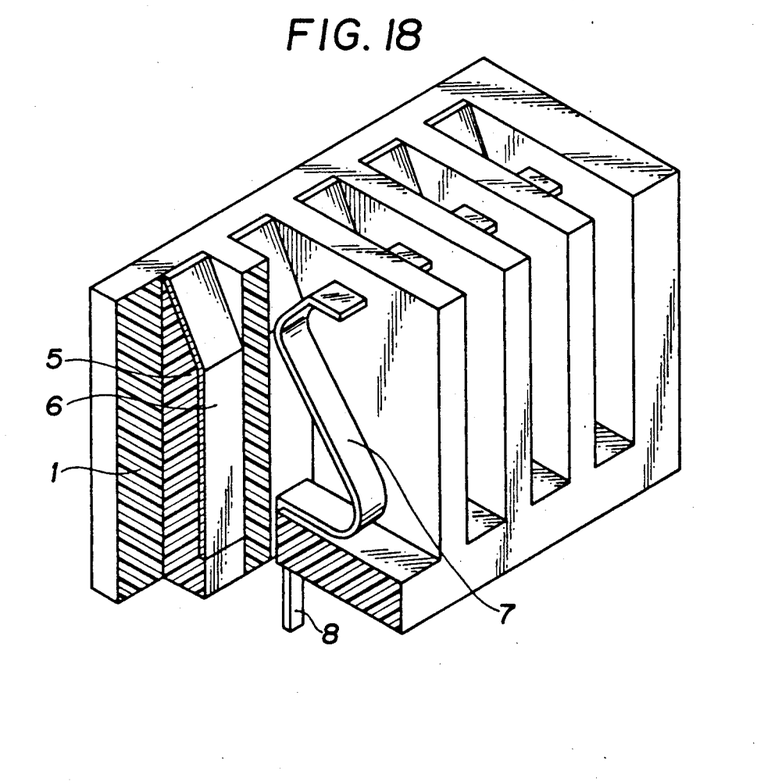
FIG. 18 is a perspective view showing an embodiment in which one side of an accommodating chamber of a connector body is opened to enhance the forming of the conductive deposit.

Next, in the example shown in FIG. 18, the wall opposite the inner wall of the accommodating chamber 4 to which the conductive deposit is applied is omitted so as to open up the chamber 4 sideways so that the conductive deposit 6 can easily be applied to the inner wall through the opened up portion of the accommodating chamber 4.

Figure 19:
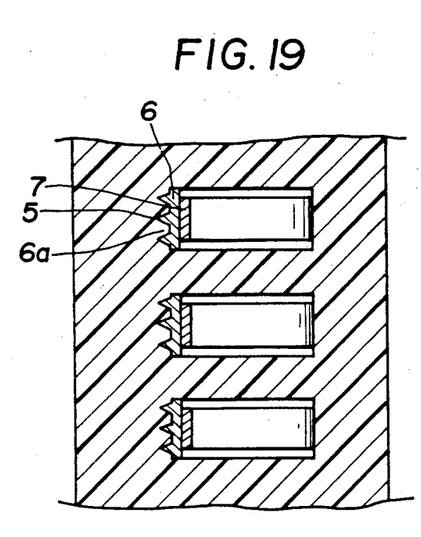
FIG. 19 is a sectional view showing an embodiment in which the conductive deposit is thicker at a portion thereof adjacent the attaching surface so as to provide bite.

FIG. 19 shows still another example in which a plurality of knob portions 6a which bite into the inner wall of the accommodating chamber 4 are formed on a surface of the conductive deposit 6. In particular, the knob portions 6a are formed on a portion of the conductive deposit which contacts the terminal 3, so that even if the conductive deposit 6 becomes worn, a favorable contacted state can be maintained by virtue of the provision of the knob portions 6a.

Figure 20:
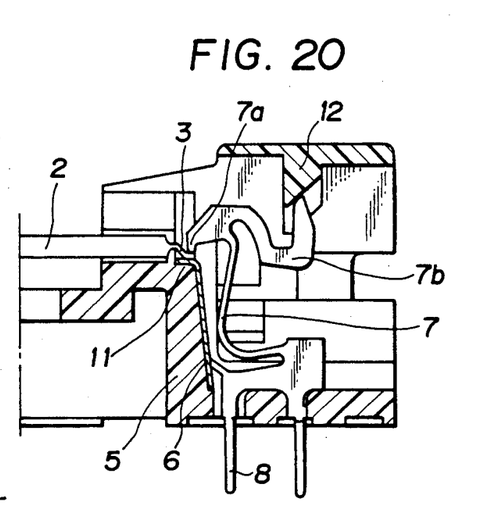
FIG. 20 is a sectional view of the connector showing the example in which the present invention is applied to a connector used for mounting an IC with terminals projecting sideways therefrom.
Figure 21:
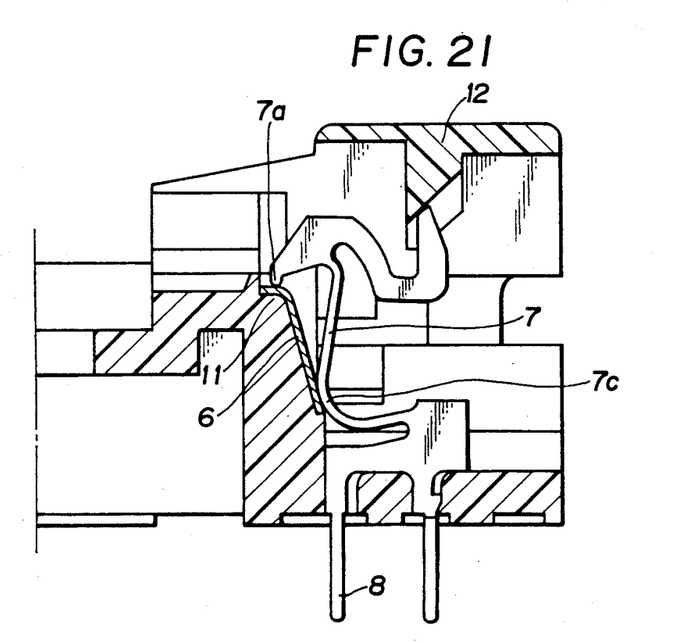
FIG. 21 is a sectional view exemplifying means for shorting the conductive deposit and the resilient pressurizing piece in the connector.

FIGS. 20 and 21 show a concrete example of a connector which is used when the terminal of the IC is projected sideways. As apparent from the Figures, a rack portion 11 is formed at a portion corresponding to a lower surface of the terminal 3 when the IC is mounted on the connector body 1. The conductive deposit 6 is applied to the surface of the rack portion 11 and the surface of a side wall continuous to the rack portion 11. An upper end of the conductive deposit 6 is disposed on the surface of the rack portion 11 and is adapted to contact with a lower surface of the terminal 3, and a lower end of the conductive deposit 6 is shorted against the lower end of the resiliently pressurizing piece 7 or the end of the mail terminal 8 through any of the plurality of above exemplified resilient shorting pieces, etc. Also, the resilient pressurizing piece 7 is provided on its upper end with a contact point portion 7a for pressing against the upper surface of the terminal 3, and the terminal 3 is pressed against the end portion of the conductive deposit 6 by the contact point portion 7a to hold the terminal 3 therebetween, to thereby realize a contacted state. Furthermore, an arm 7b is extended backward of the contact point portion 7a and by pushing down the end portion of the arm 7b with an operating member 12, the contact point portion 7a is displaced diagonally upwardly and backwardly in order to cancel the contacted state.

In FIG. 21, as a means for shorting the resilient pressurizing piece 7 and the conductive deposit 6, a portion of the resilient pressurizing piece 7 is warped in such a manner as to be projected toward the conductive deposit 6 and the warped portion resiliently contacts the surface of the conductive deposit, to thereby result in a short.

Figure 22:
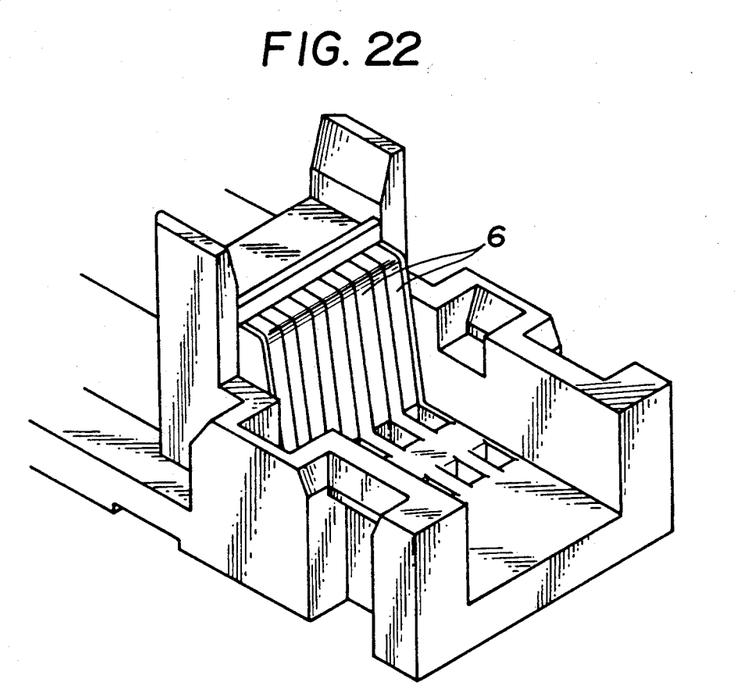
FIG. 22 is a perspective view showing an embodiment in which a conductive deposit is applied to a common plane having no partition.
Figure 23:
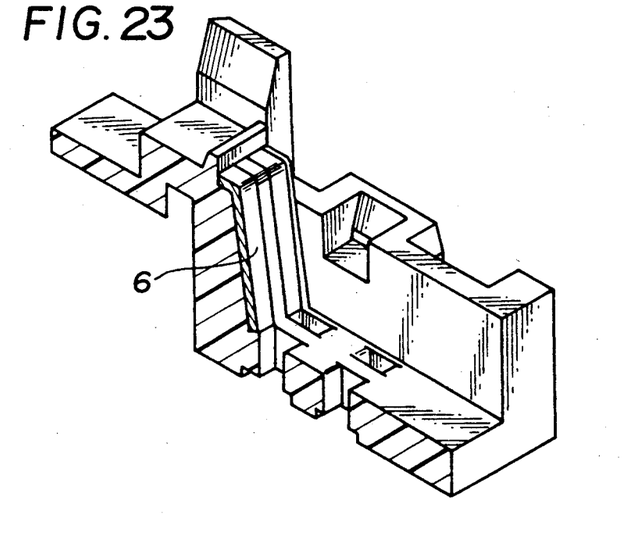
FIG. 23 is a perspective view showing the above but in section.

Next, FIGS. 22 and 23 show the connector of FIG. 20 but in which no partitions 13 are formed between the various individual conductive deposits 6. Rather, the conductive deposits 6 are applied on the same plane in order to enhance a metal plating. Furthermore, a portion opposite the common plane having the conductive deposit applied thereto is opened up in order to provide for easy embedding of the resilient pressurizing piece 7.

As a means for forming the conductive deposit 6 on the surface of a synthetic resin (the surface configured by molding of the connector body), there can be listed an example in which a conductive printing layer is formed by grounding, and an electro or electroless plating is applied to the surface of the conductive printing layer. It goes without saying that the conductive deposit may be applied without forming the conductive printing layer.

As described in the foregoing, one holding portion for holding the terminal of an electric part is configured by the molding portion of the connector body and by applying a conductive deposit firmly and intimately attached to the surface of the configured portion. The terminal of the electric part is held between the conductive deposit and the resilient pressurizing piece of a single piece structure disposed opposite the conductive deposit. By pressing the terminal to the conductive deposit with the resilient pressurizing place, there can be obtained a favorable electrical contact.

In the above-mentioned connector, the resilient pressurizing piece for holding the terminal of the electric part is of a single piece structure. Accordingly, complicated treatment for providing various holding structures to a conventional contact having a pair of punched contacting piece is no longer required, and the molding can be done with ease and material consumption can be greatly reduced. Furthermore, the chamber for accommodating the connector body is limited to a space just large enough to accommodate a single resilient pressurizing piece. This is advantageous for realizing fine pitches and a compact size. In addition, in spite of its single piece structure, a reliable electrical contact can be obtained by utilizing almost the same contacting pressure as in the prior art.

In the above-mentioned connector, it is possible that only the conductive deposit functions as a conventional contact forming element, or that the conductive deposit and the resilient pressurizing piece function as the contact forming element.

While several embodiments of the invention have been shown and described in detail to illustrate the application of the principles of the invention, it will be understood that the invention may be embodied otherwise without departing from such principles.

What is claimed is:

1. A connector for providing electrical contact by holding a terminal of an electric part, comprising:
   a connector body having a socket formed therein for receipt of the terminal of the electric part, said socket having an inner wall with a molded holding portion for holding the terminal of the electric part;
   a layer of conductive material deposited on and along a surface of said inner wall of said socket;
   pressing means for pressing the terminal of the electric part against said conductive layer, said pressing means comprising a resilient pressurizing piece mounted in said socket opposite said conductive layer such that a portion of said resilient pressurizing piece normally contacts said conductive layer adjacent said holding portion of said inner wall of said socket; and
   a male terminal in direct contact with a portion of said conductive layer spaced from said portion of said conductive layer adjacent said holding portion of said inner wall of said socket.

2. A connector as recited in claim 1, wherein
   said male terminal is in electrical contact with a portion of said resilient pressurizing piece spaced from said portion thereof which normally contacts said conductive layer adjacent said holding portion of said inner wall of said socket, so as to form a short circuit when said resilient pressurizing piece is in contact with said conductive layer adjacent said holding portion of said inner wall of said socket.

3. A connector as recited in claim 1, wherein
   said male terminal and said resilient pressurizing piece are formed as a single piece.

4. A connector as recited in claim 3, wherein said male terminal includes means for pressing a portion of said conductive layer into said inner wall of said socket.

5. A connector as recited in claim 4, wherein
   said means for pressing a portion of said conductive layer into said inner wall of said socket comprises a knob portion of said male terminal protruding toward said inner wall of said socket.

6. A connector for providing electrical contact by holding a terminal of an electric part, comprising:
   a connector body having a socket formed therein for receipt of the terminal of the electric part, said socket having an inner wall with a molded holding portion for holding the terminal of the electric part;
   a layer of conductive material deposited on and along a surface of said inner wall of said socket;
   pressing means for pressing the terminal of the electric part against said conductive layer, said pressing means comprising a resilient pressurizing piece mounted in said socket opposite said conductive layer such that a portion of said resilient pressurizing piece normally contacts said conductive layer adjacent said holding portion of said inner wall of said socket;
   a male terminal in direct contact with a portion of said conductive layer spaced from said portion of said conductive layer adjacent said holding portion of said inner wall of said socket; and
   wherein said resilient pressurizing piece is mounted in electrical contact with said conductive layer at a location spaced from said portion of said conductive layer adjacent said holding portion of said inner wall of said socket.

7. A connector as recited in claim 6, wherein
   said resilient pressurizing piece is mounted such that it resiliently presses against said conductive layer at a location spaced from said portion of said conductive layer adjacent said holding portion of said inner wall of said socket.

* * * * *